United States Patent [19]

Koury, Jr.

[11] Patent Number: 4,757,029

[45] Date of Patent: Jul. 12, 1988

[54] METHOD OF MAKING VERTICAL FIELD EFFECT TRANSISTOR WITH PLURALITY OF GATE INPUT CNNECTIONS

[75] Inventor: Daniel N. Koury, Jr., Scottsdale, Ariz.

[73] Assignee: Motorola Inc., Schaumburg, Ill.

[21] Appl. No.: 45,502

[22] Filed: May 4, 1987

[51] Int. Cl.[4] .................... H01L 21/265; H01L 21/18
[52] U.S. Cl. ......................................... 437/90; 437/34; 437/50; 437/180; 437/983
[58] Field of Search ...................... 437/34, 50, 90, 983, 437/911, 180; 357/23.4

[56] References Cited

U.S. PATENT DOCUMENTS

| | | |
|---|---|---|
| 3,520,741 | 7/1970 | Mankarious ........................ 437/25 |
| 3,841,917 | 10/1974 | Shannon ............................. 437/24 |
| 4,259,366 | 3/1981 | Balasubraminian et al. ....... 437/193 |
| 4,408,384 | 10/1983 | Lowis et al. ................... 437/913 X |
| 4,466,173 | 8/1984 | Baliga ............................. 437/90 X |

*Primary Examiner*—George T. Ozaki
*Attorney, Agent, or Firm*—Harry A. Wolin

[57] ABSTRACT

A method of making a vertical field effect transistor (FET) having a plurality of gates which are isolated from each other. Each gate has a contact thereby enabling a single gate which is turned "on" to cause the vertical FET to conduct a current. This configuration allows for a logical "or" function to be implemented in a vertical FET.

7 Claims, 2 Drawing Sheets

METHOD OF MAKING VERTICAL FIELD EFFECT TRANSISTOR WITH PLURALITY OF GATE INPUT CNNECTIONS

BACKGROUND OF THE INVENTION

This invention generally pertains to a vertical field effect transistor (FET) implementing a logical "or" function. In the past, technology has not been such that a logical "or" function could easily be implemented in a FET. In order to obtain a logical "or" function using FETs, more than one had to be used thereby causing more space to be used and being expensive to manufacture. Commonly, FETs have implemented logical "and" functions and have been used in various MOS applications. The development of a vertical FET has given rise to many more applications using FETs which save both space and money. However, a single FET which could implement a logical "or" function has not been developed prior to this time. Therefore, a single FET having multiple gates which could implement a logical "or" function is highly desirable.

SUMMARY OF THE INVENTION

The present invention pertains to a vertical field effect transistor (FET) implementing a logical "or" function. By processing a vertical FET having multiple gates which are isolated from each other, a FET implementing a logical "or" function may be manufactured. With this arrangement, any of the multiple gates which are turned "on" would cause the FET to conduct a current. The multiple gates are isolated from each other by some means, such as isolation oxide dielectric layers, thereby enabling the logical "or" function to occur.

It is an object of the present invention to provide a new vertical FET implementing a logical "or" function.

It is a further object of the present invention to provide a new vertical FET implementing a logical "or" function which may be cheaply manufactured.

It is a further object of the present invention to provide a new vertical FET implementing a logical "or" function which will take up a minimum of space.

It is a further object of the present invention to provide a new vertical FET implementing a logical "or" function which may be manufactured with a high yield.

It is a further object of the present invention to provide a new vertical FET implementing a logical "or" function which may be used in various MOS applications.

These and other objects of this invention will become apparent to those skilled in the art upon the consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 3:
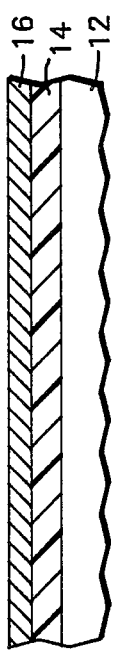
FIGS. 1 and 3 through 9 are highly enlarged cross-sectional views of a silicon substrate illustrating various process steps in the production of a vertical FET having multiple gates.
Figure 1:
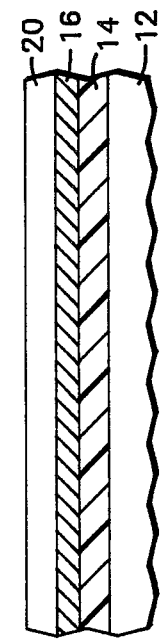
Figure 2:
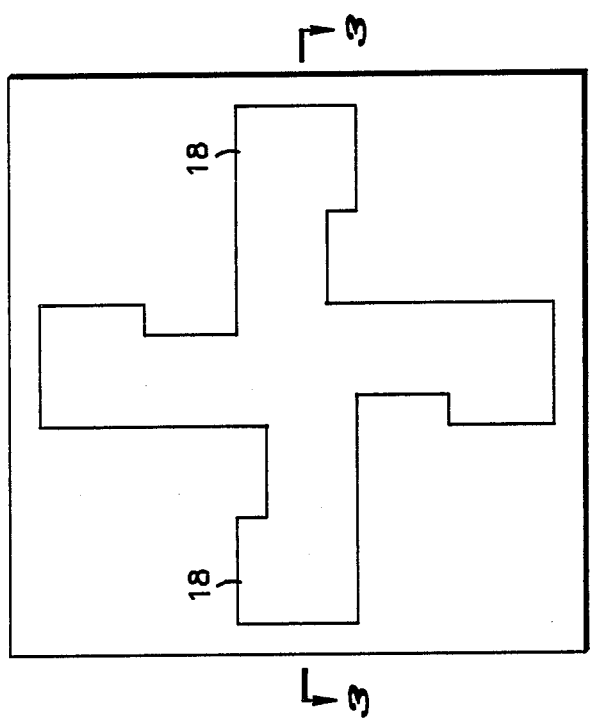
FIG. 2 is a highly enlarged top view of the substrate of FIG. 1 after patterning.

Referring specifically to FIGS. 1 and 2, a highly enlarged cross-sectional view and a highly enlarged top view are shown during the processing of a vertical FET, 10, embodying the present invention. Initially, a silicon wafer, 12, is provided. Upon silicon wafer 12, a first oxide dielectric layer, 14, is formed. Next a polycrystalline silicon layer, 16, is deposited on first oxide dielectric layer 14. Once polycrystalline silicon layer 16 is formed on first oxide dielectric layer 14, polycrystalline silicon layer 16 is patterned so as to create a plurality of input gates, 18. To pattern plurality of input gates 18, a photoresist layer, 20, is applied to polycrystalline silicon layer 16. FIG. 3 shows a highly enlarged cross-sectional view of vertical FET 10 from line 3—3 of FIG. 2 after a plurality of input gates 18 have been patterned and photoresist layer 20 has been removed.

Figure 4:
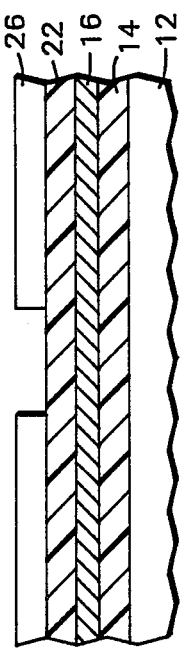
Figure 5:
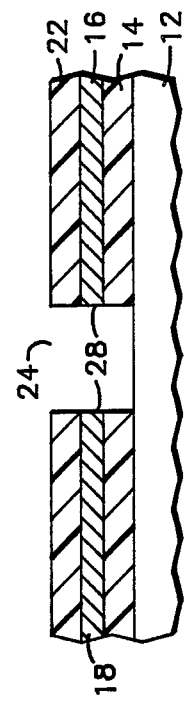
Figure 6:
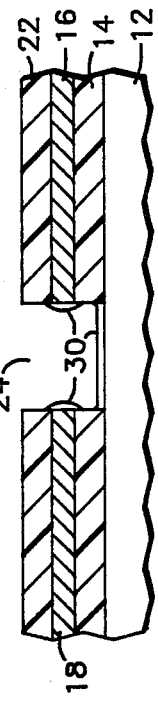

Referring specifically to FIGS. 4, 5 and 6, highly enlarged cross-sectional views are shown during further processing steps. After the patterning of plurality of input gates 18 in polycrystalline silicon layer 16, a second oxide dielectric layer, 22, is formed over the surface of first dielectric layer 14 and input gates 18. After the forming of first dielectric layer 14, polycrystalline silicon layer 16, second oxide dielectric layer 22 and the patterning of plurality of input gates 18, an opening 24 is formed. To form opening 24, a photoresist layer, 26, is applied on second oxide dielectric layer 22 and patterned (see FIG. 4) to define opening 24. Layers 22, 16 and 14 are then etched to form opening 24 (see FIG. 5). Opening 24 extends to silicon wafer 12 and also exposes an edge, 28, of each member of said plurality of input gates 18. Once edges 28 are exposed by etching opening 22, a gate oxide dielectric layer, 30, is formed on each edge 24 of each member of said plurality of input gates 18. Gate oxide layer 30 also forms on silicon wafer 12 (see FIG. 6) and must be removed. An anisotropic etching solution is most commonly used.

Figure 7:
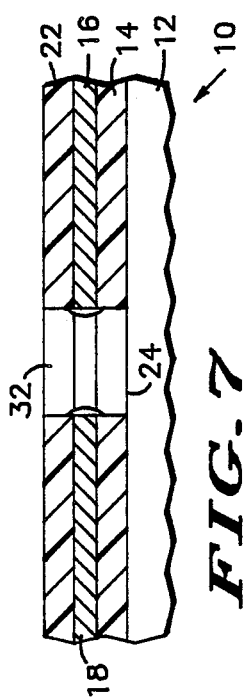

Referring specifically to FIG. 7, a highly enlarged cross-sectional view of vertical FET 10 is shown during further processing. Once opening 24 has been etched and gate oxide dielectric layer 30 formed on edges 28 of plurality of input gates 18, an epitaxial island, 32, which is seated on silicon wafer 12 is grown in opening 24. Epitaxial island 32 may be doped during its growth or after its growth by ion implantation. Additionally, a combination of doping during growth and doping after growth by ion implantation may be used to dope epitaxial island 32. Epitaxial island 32 must be doped so that its PN junctions approximately correspond to the conductive characteristics of first oxide dielectric layer 14, polycrystalline silicon layer 16, and second oxide dielectric layer 22

Figure 8:
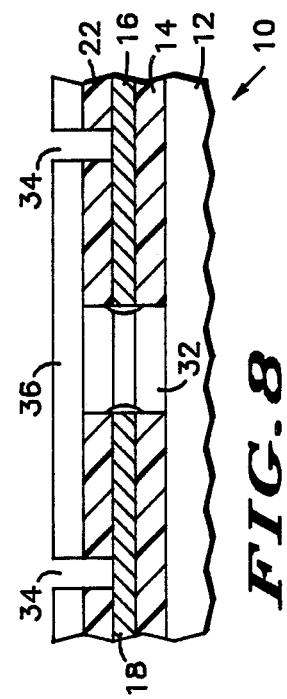
Figure 9:
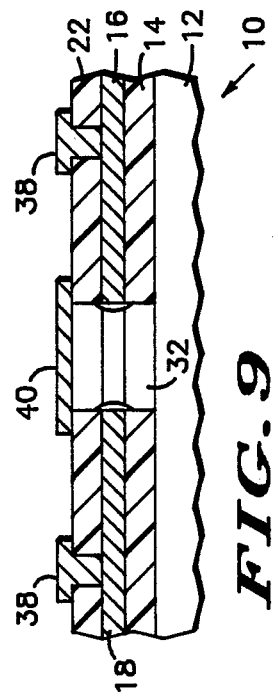

Referring specifically to FIGS. 8 and 9, highly enlarged cross-sectional views of vertical FET 10 are shown during further processing and after processing, respectively. After the completion of the doping of epitaxial island 32, a plurality of holes, 34, are etched in vertical FET 10. To do this, a photoresist layer, 36, is applied to second oxide dielectric layer 22 and patterned to define holes 34. Holes 34 are etched through dielectric layer 22 so as to extend to polycrystalline silicon layer 16. Once holes 34 are etched to polycrystalline silicon layer 16, a plurality of electrical contacts, 38, are deposited in holes 34 so that they contact polycrystalline silicon layer 16 and extend outward of holes 34. There will be at least one contact 34 extending into each polycrystalline silicon layer 16 of each member of plurality of input gates 18. This is so each member of plurality of input gates 18 may be turned "on" separately. Additionally, a metal contact, 40, is formed over epitaxial island 32 to serve as a drain contact for vertical FET 10.

Figure 10:
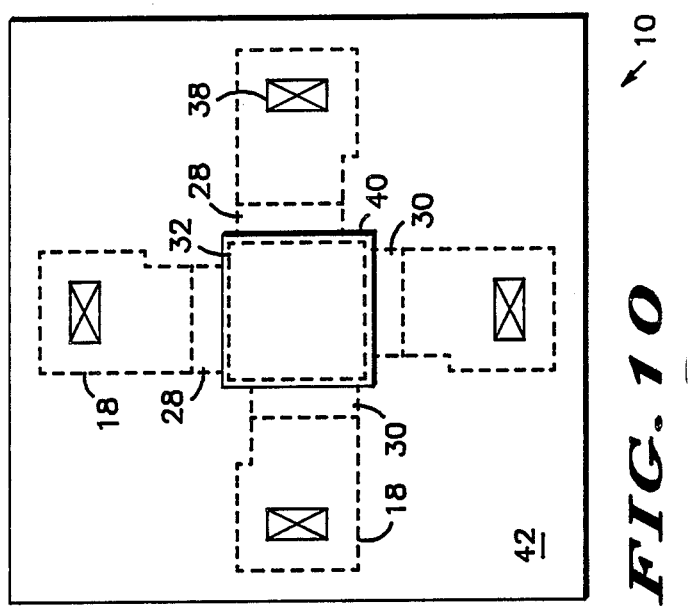
FIG. 10 is a highly enlarged top view of a vertical FET having multiple gates, hidden parts thereof shown in dotted lines.

Referring specifically to FIG. 10, a top view of vertical FET 10 is shown. Epitaxial island 32 is disposed in the center of vertical FET 10 and is covered by metal drain contact 40. Extending therefrom are plurality of input gates 18. This embodiment shows plurality of input gates 18 having four members, although it should be understood that depending upon the configuration of vertical FET 10 and the "or" gate desired, more or less members of plurality of input gates 18 may be employed. Gate oxide dielectric layer 30 insulates edges 28 of plurality of input gates 18 from epitaxial island 32. An isolation oxide dielectric layer, 42, isolates the plurality of input gates 18 from each other. Isolation oxide dielectric layer 42 is comprised of first oxide dielectric layer 14 and second oxide dielectric layer 22. Further, each member of plurality of input gates 18 is shown to have one electrical contact 38 in this configuration. The result of this configuration is that a vertical FET 10 may conduct a current when any member of plurality of input gates 18 is turned "on". Vertical FET 10 thereby implements a logical "or" function. It should be understood to one skilled in the art that depending upon the manner in which vertical FET 10 is hooked up in a circuit, a logical "nor" function may also be implemented.

Because this vertical FET configuration which implements a logical "or" function takes up less space on silicon wafer 12, more vertical FETs 10 can be produced on a silicon wafer using the same number of processing steps. This enables the manufacture of vertical FETs 10 to be relatively inexpensive. Additionally, since more vertical FETs 10 can be processed on the good areas of silicon wafer 12, the yield is much higher per silicon wafer 12. Also, this may be used in various MOS applications.

Thus it is apparent that there has been provided, in accordance with the invention, a new vertical FET implementing a logical "or" function which meets the objects and advantages set forth above. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and scope of this invention.

What is claimed is:

1. A method for making a vertical field effect transistor (FET) which implements a logical "or" function comprising the steps of:
   providing a silicon wafer;
   forming a first dielectric layer on said silicon wafer;
   forming a polycrystalline silicon layer on said first dielectric layer;
   patterning said polycrystalline silicon layer to create a plurality of input gates;
   forming a second dielectric layer on said patterned polycrystalline silicon layer;
   forming an opening to said silicon wafer, said opening exposing an edge of each member of said plurality of input gates;
   forming a gate dielectric layer on each of said edges of each member of said plurality of input gates; and
   growing an epitaxial island seated on said silicon wafer in said opening, said island being doped to form a field effect transistor.

2. The method of claim 1 wherein the first, second and gate dielectric layers are comprised of oxide.

3. The method of claim 1 wherein the epitaxial island is doped during its growth.

4. The method of claim 1 wherein the epitaxial island is doped by ion implantation after its growth.

5. The method of claim 1 wherein the epitaxial island is doped both during its growth and after its growth by ion implantation.

6. The method of claim 5 further comprising the steps of etching holes and disposing contacts in said holes, said contacts extending into said polycrystalline silicon layer and at least one of said contacts extending into each member of the plurality of input gates.

7. A method for making a vertical field effect transistor (FET) which implements a logical "or" function comprising the steps of:
   providing a silicon wafer;
   forming a first oxide dielectric layer on said silicon wafer;
   forming a polycrystalline silicon layer on said first oxide dielectric layer;
   patterning said polycrystalline silicon layer to create a plurality of input gates;
   forming a second oxide dielectric layer on said patterned polycrystalline silicon layer;
   forming an opening to said silicon wafer, said opening exposing an edge of each member of said plurality of input gates;
   forming a gate oxide dielectric layer on each of said edges of each member of said plurality of input gates;
   growing an epitaxial island seated on said silicon wafer in said opening, said island being doped to form a field effect transistor; and
   etching holes and disposing contacts in said holes, said contacts extending into said polycrystalline silicon layer and at least one of said contacts extending into each member of said plurality of input gates.

* * * * *

UNITED STATES PATENT AND TRADEMARK OFFICE
CERTIFICATE OF CORRECTION

PATENT NO. : 4,757,029

DATED : July 12, 1988

INVENTOR(S) : Daniel N. Koury, Jr.

It is certified that error appears in the above-identified patent and that said Letters Patent is hereby corrected as shown below:

In TITLE (first page) CHANGE "CNNECTIONS" to

-- CONNECTIONS --.

Signed and Sealed this

Seventeenth Day of January, 1989

Attest:

DONALD J. QUIGG

*Attesting Officer*      *Commissioner of Patents and Trademarks*